(12) United States Patent
Weimer et al.

(10) Patent No.: US 12,401,014 B2
(45) Date of Patent: Aug. 26, 2025

(54) THIN FILM COATINGS ON MIXED METAL OXIDES

(71) Applicant: THE REGENTS OF THE UNIVERSITY OF COLORADO, A BODY CORPORATE, Denver, CO (US)

(72) Inventors: Alan W. Weimer, Niwot, CO (US); Amanda Hoskins, Broomfield, CO (US)

(73) Assignee: The Regents of the University of Colorado, Denver, CO (US)

( * ) Notice: Subject to any disclaimer, the term of this patent is extended or adjusted under 35 U.S.C. 154(b) by 288 days.

(21) Appl. No.: 15/930,249

(22) Filed: May 12, 2020

(65) Prior Publication Data

US 2020/0274138 A1    Aug. 27, 2020

Related U.S. Application Data

(63) Continuation of application No. PCT/US2018/057133, filed on Oct. 23, 2018.

(Continued)

(51) Int. Cl.
*H01M 4/04* (2006.01)
*C23C 16/06* (2006.01)
(Continued)

(52) U.S. Cl.
CPC .......... *H01M 4/0428* (2013.01); *C23C 16/06* (2013.01); *C23C 16/4417* (2013.01);
(Continued)

(58) Field of Classification Search
None
See application file for complete search history.

(56) References Cited

U.S. PATENT DOCUMENTS 9,196,901 B2    11/2015  Se-Hee et al.
9,843,041 B2 *  12/2017  Lopez ............... H01M 10/0525
(Continued)

FOREIGN PATENT DOCUMENTS

JP    2002141062 A    5/2002
JP    2014170656 A    9/2014
(Continued)

OTHER PUBLICATIONS

International Search Report mailed Dec. 13, 2018, received in corresponding International Application No. PCT/US2018/057133, 3 pages.

(Continued)

*Primary Examiner* — Tracy M Dove
(74) *Attorney, Agent, or Firm* — Snell & Wilmer L.L.P.

(57) ABSTRACT

The invention relates to lithiated mixed metal compositions having ultrathin film coatings of varying thicknesses on lithium ion sites and on metal oxide sites, wherein the thickness of the ultrathin film at least partially covering the metal oxide sites is greater than the thickness of the ultrathin film at least partially covering the lithium ion sites. Also disclosed is a method for forming the compositions, comprising selectively coating one area of a multi-component substrate. Materials such as mixed metal oxides, for use in lithium battery electrodes, may be improved by a coating which preferentially deposits onto one or more elements in the mixed material but not another.

20 Claims, 6 Drawing Sheets

Related U.S. Application Data

(60) Provisional application No. 62/585,300, filed on Nov. 13, 2017.

(51) Int. Cl.

| | | |
|---|---|---|
| *C23C 16/44* | (2006.01) | |
| *C23C 16/455* | (2006.01) | |
| *H01M 4/485* | (2010.01) | |
| *H01M 4/505* | (2010.01) | |
| *H01M 4/525* | (2010.01) | |
| *H01M 10/0525* | (2010.01) | |

(52) U.S. Cl.
CPC ....... *C23C 16/45527* (2013.01); *H01M 4/485* (2013.01); *H01M 4/505* (2013.01); *H01M 4/525* (2013.01); *H01M 10/0525* (2013.01)

(56) References Cited

U.S. PATENT DOCUMENTS

| | | | |
|---|---|---|---|
| 2011/0236575 A1* | 9/2011 | King | C23C 16/45555 118/712 |
| 2012/0077082 A1* | 3/2012 | Se-Hee | H01M 4/485 427/78 |
| 2012/0301778 A1 | 11/2012 | Trevey et al. | |
| 2014/0162132 A1 | 6/2014 | Ishii et al. | |
| 2014/0234715 A1* | 8/2014 | Fasching | H01M 4/139 429/231.95 |
| 2015/0180023 A1 | 6/2015 | Xiao et al. | |
| 2016/0211517 A1 | 7/2016 | Beck et al. | |
| 2017/0018767 A1 | 1/2017 | Park et al. | |

FOREIGN PATENT DOCUMENTS

| | | |
|---|---|---|
| KR | 10-2015-0008667 A | 1/2013 |
| KR | 10-2013-0014245 A | 2/2013 |
| KR | 10-2013-0014525 A | 2/2013 |
| KR | 10-2015-0014892 A | 2/2015 |
| KR | 10-2015-0032356 A | 3/2015 |
| WO | 2016196688 A1 | 12/2016 |
| WO | WO-2017/025957 A1 | 2/2017 |

OTHER PUBLICATIONS

Search Opinion from European Application 18876712.3, dated Jul. 22, 2021.
Supplementary Search Report from European Application 18876712.3, dated Jul. 13, 2021.
1st Office Action from Indian application 202017023973, dispatched Feb. 26, 2021.
1st Office Action from Canadian application 3082471, dispatched Jun. 21, 2021.
Machine translation of description of Japanese Patent Application Publication JP2014170656A.
Written Opinion mailed Dec. 13, 2018 in counterpart International Application No. PCT/US2018/057133.
Communication pursuant to Rules 70(2) and 70a(2) EPC mailed Aug. 10, 2021 in counterpart European Application No. 18876712.3.
Examiner's Requisition mailed Jan. 10, 2022 in counterpart Canadian Application No. 3082471.
Office Action mailed Jan. 26, 2022 in counterpart Korean Application No. 10-2020-7016939.
Office Action mailed Oct. 10, 2022 in counterpart Chinese Application No. 201880086370.8.
Notice of Reasons for Rejection mailed Oct. 18, 2022 in counterpart Japanese Application No. 2020-544326.
Final Office Action mailed Nov. 4, 2022 in counterpart Korean Application No. 10-2020-7016939.
Notice of Allowance mailed Mar. 16, 2023 in counterpart Chinese Application No. 201880086370.8.
Final Office Action mailed Jul. 27, 2023 in counterpart Japanese Application No. 2020-544326.
First Examination Report mailed Aug. 23, 2023 in counterpart Australian Application No. 2018365469.
Preliminary Rejection mailed Aug. 28, 2023 in counterpart Korean Divisional Application No. 10-2023-7004455.

* cited by examiner

THIN FILM COATINGS ON MIXED METAL OXIDES

CROSS-REFERENCE TO RELATED APPLICATIONS

This application is a continuation of International Application No. PCT/US2018/057133 filed on Oct. 23, 2018 which claims the benefit of and priority to U.S. Provisional Patent Application No. 62/585,300 filed on Nov. 13, 2017, the disclosure of each of which is incorporated herein by reference in its entirety.

BACKGROUND OF THE INVENTION

The development of ultra-thin coatings has been challenging. Prior to the compositions and methods disclosed herein, it has not been possible to selectively apply such ultrathin coatings onto materials of different compositions. We have found no publicly reported attempts to do so. Prior art film coatings on lithiated metal compositions for use in lithium ion battery electrodes have been limited to conformal films of uniform thickness, the films uniformly coating both lithium sites and other metal sites. Further, the prior art literature indicates that thicker films are better than thinner films. Additional challenges include the application of coatings onto powdered materials without aggregating the materials together.

SUMMARY OF THE INVENTION

A problem to be solved is the poor performance of lithium ion batteries as compared to non-lithium ion cells, including factors such as charge/discharge rates, lifetime, and conductivity. Prior to our invention, there have been no identifiable, predictable, cutting-edge or breakthrough solutions to the recognized need for improving lithium ion batteries.

We have now discovered lithiated mixed metal compositions having ultrathin film coatings of varying thicknesses on lithium ion sites and on metal oxide sites, wherein the thickness of the ultrathin film at least partially covering the metal oxide sites is greater than the thickness of the ultrathin film at least partially covering the lithium ion sites. Also disclosed herein is a method for forming the compositions, the method comprising selectively coating one area of a multi-component substrate. Materials such as a mixed metal oxides may be improved by a coating that preferentially deposits onto one or more elements in the mixed material but not onto another. The discovered compositions are useful, for example, in lithium ion battery electrodes.

Our disclosure includes compositions and methods of preparation wherein, unexpectedly, improved performance is demonstrated for lithium ion battery electrodes using our non-uniform coatings deposited on lithiated mixed metal compositions, using a number of atomic layer deposition cycles much smaller than that advocated by the prior art. In contrast to the prior art, we now disclose, inter alia, that non-uniform film limited by certain thicknesses, e.g., no greater than 4 nm, is best when Li sites are not coated as thickly as are the other metal sites.

The invention inter alia includes the following, alone or in combination. In one embodiment, the present invention relates, in part, to the discovery of a substrate comprising a lithiated metal oxide having the formula $LiM_xO_y$, and comprising M-oxide sites and lithium ion sites, wherein M is at least one non-lithium metal; and an ultrathin film chosen from a non-lithium-containing metal oxide film and a metal fluoride film, the ultrathin film having a thickness of from a zero or non-detectable thickness to about 4 nanometers, the ultrathin film coherently, at least partially covering the M-oxide sites and the lithium ion sites, with the proviso that the thickness of the ultrathin film at least partially covering the M-oxide sites is greater than the thickness of the ultrathin film at least partially covering the lithium ion sites.

In one embodiment of the invention, the above described ultrathin non-lithium-containing metal oxide film or the ultrathin metal fluoride film has a thickness of from a zero or non-detectable thickness to about 3 nanometers. In another embodiment of the invention, the ultrathin non-lithium-containing metal oxide film or the ultrathin metal fluoride film has a thickness of from a zero or non-detectable thickness to about 2 nanometers.

In yet another embodiment, the lithiated metal oxide substrate is in the form of particles, and the average diameter of the lithiated metal oxide particles is no larger than 100 micrometers. In some embodiments, the average diameter of the lithiated metal oxide particles is from about 0.05 micrometers to about 60 micrometers.

The metal represented by "M" in the lithiated metal oxide having the formula $LiM_xO_y$, in an embodiment of the disclosed substrate is chosen from at least one of Co, Ni, Mn, Fe, Al, and Ti. Non-limiting examples of the lithiated metal oxide in various embodiments of the disclosed substrate are chosen from at least one of lithium cobalt oxide ($LiCo_xO_y$), lithium nickel oxide ($LiNi_xO_y$), lithium manganese oxide ($LiMn_xO_y$), lithium nickel cobalt manganese oxide, ($LiNi_xCo_yMn_zO_{zz}$), lithium nickel cobalt manganese iron oxide ($LiNi_xCo_yMn_zFe_{yy}O_{zz}$), lithium iron phosphate $LiFe_xPO_y$), lithium nickel cobalt aluminum oxide ($LiNi_xCo_yAl_zO_{zz}$), and lithium titanate ($LiTi_xO_y$). Lithium nickel cobalt manganese oxide ($LiNi_xCo_yMn_zO_{zz}$) is also referred to herein as "NMC."

In one embodiment of the invention, the ultrathin non-lithium-containing metal oxide film is $Al_2O_3$. Non-limiting examples of other embodiments of the invention include ultrathin films chosen from chosen from at least one of MgO, $Al_2O_3$, $SiO_2$, $TiO_2$, ZnO, $SnO_2$, $ZrO_2$, $NbO_3$, and $B_2O_3$. Non-limiting examples of yet other embodiments of the invention include ultrathin films chosen from chosen from at least one of $CaF_2$, $SrF_2$, $ZnF_2$, $ZrF_4$, $MnF_2$, $HfF_4$, and $MgF_2$.

In one embodiment of the disclosed invention, the ultrathin non-lithium-containing metal oxide film or the ultrathin metal fluoride film is deposited by atomic layer deposition (ALD). The disclosed ultrathin films may be deposited on the lithiated metal oxide by ALD using from about 2 ALD cycles to about 11 ALD cycles or using from about 3 ALD cycles to about 10 ALD cycles. In another embodiment of the invention, the ultrathin non-lithium-containing metal oxide film or the ultrathin metal fluoride film is deposited by atomic layer deposition (ALD) using 6 or fewer ALD cycles.

BRIEF DESCRIPTION OF THE DRAWINGS

The foregoing and other objects, features and advantages of the invention will be apparent from the following more particular description of illustrative embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1B:
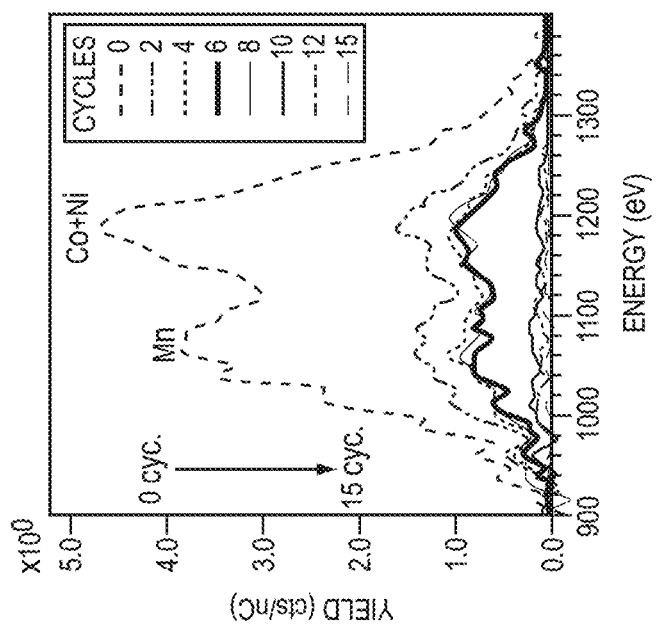
FIG. 1B is a graphical representation of the LEIS spectra of the Mn and Co+Ni characteristic peaks obtained when an ultra-thin alumina film was applied to cathode particles by ALD with 2, 4, 6, 8, 10, 12 and 15 cycles.

A description of preferred embodiments of the invention follows. It will be understood that the particular embodiments of the invention are shown by way of illustration and not as limitations of the invention. At the outset, the invention is described in its broadest overall aspects, with a more detailed description following. The features and other details of the compositions and methods of the invention will be further pointed out in the claims.

The present invention is directed to a composition of matter and methods for producing a selectively coated lithiated metal oxide substrate. Disclosed herein is a method wherein a metal oxide, such as aluminum oxide, is preferentially coated onto, for example, nickel, manganese and cobalt metal sites in the lithiated metal oxide substrate, while leaving the lithium sites uncoated. The term "preferentially," as used herein, means "to a greater degree," or "at a faster rate," or "with greater likelihood."

The invention inter alia also includes the following embodiments, alone or in combination. One embodiment of the method of the invention is carried out by use of gas phase sequential self-limiting chemistry to deposit or grow the coating. Atomic layer deposition (ALD) is especially preferred because it can control the thickness of the films and allow the particles to be individually coated.

As used herein, a thin film or an ultrathin film is a film that ranges in thickness from essentially zero thickness to a thickness of several nanometers (nm). As used herein, a "zero thickness" is a thickness that is not detectable or a thickness that tends to zero.

ALD includes exposing the substrate to first one gas phase reagent and then subsequently a second gas phase reagent. These reagents individually react with the surface of the substrate until no more favorable reaction sites are present. This is repeated until the film is the desired thickness.

Atomic layer deposition onto mixed metal oxide particles can be accomplished in a suitable particle handling system such as a fluidized bed, rotating drum, sequential batch mixer or vibrating reactor. These systems provide the ideal environment for the particles to interact with the gases and be coated while not aggregating the particles together.

ALD is a gas phase deposition method that is performed using repeated cycles of alternating exposures of the substrate surface to different precursors followed by purges of unreacted precursor. Typically, each precursor reacts with surface reactive functional groups, resulting in a half-reaction of the overall chemical vapor deposition (CVD) reaction. Precursors do not self-react, but react only with the functionalized surface produced by reaction with the complementary precursor. Consequently, the deposition produced by each half-reaction proceeds until no further active sites are accessible to the precursor on the substrate surface, making the deposition self-limiting.

An ALD process, wherein lithiated metal oxide particles are batch-processed in at least one of a fluidized bed, a rotating tube or cylinder, and a rotating blender, can be used to prepare the ultrathin film-coated lithiated metal oxide particles according to an embodiment the invention.

An ALD process, wherein lithiated metal oxide particles are semi-batch or semi-continuously processed using at least one of sequential fluidized beds, rotating cylinders, and fixed mixers in series to move substrate particles through reaction zones, can be used to prepare the ultrathin film-coated lithiated metal oxide particles according to an embodiment of the invention.

An ALD process, wherein lithiated metal oxide particles are agitated and processed continuously and spatially, and move through successive zones where reactant gases and substrate particles are flowed continuously, can be used to prepare the ultrathin film-coated lithiated metal oxide particles according to an embodiment of the invention.

An ALD process, using a vibrating bed process incorporating directional vibration, and wherein the gas velocity is below the minimum fluidization velocity of the particles such that the particles are not fluidized, can be used to prepare the disclosed ultrathin film-coated lithiated metal oxide particles.

An ALD process, using a vibrating bed process operated in a manner such that the gas velocity is sufficient to fluidize the particles, can be used to prepare the disclosed ultrathin film-coated lithiated metal oxide particles.

Exemplification (Metal Oxide Film Coatings on Lithiated Mixed Metal Oxides):

Lithium nickel manganese cobalt oxide (NMC) particles obtained from Sigma Aldrich with the composition $LiNi_{0.33}Mn_{0.33}Co_{0.33}O_2$ were coated in a vibrating fluidized bed reactor. The reactor system consisted of a reactor tube heated in a vertical furnace, a vibration generation system, a data acquisition system (DAQ) interfaced with LabView™, and in-situ mass spectrometry. The vibration generator was used to overcome inter-particle forces and improve fluidization. High purity nitrogen gas was used to purge away unreacted precursors. A Baratron capacitance manometer was installed at the exit of the reaction zone to monitor the dosing pressure. A quadrupole mass spectrometer (Stanford Research Systems) was connected to the outlet of the reactor to monitor the progress of each half-reaction.

Alumina ALD was carried out using the 2 step TMA/water reaction (see Eq 1 & 2). The ALD reactor was encased in a clamshell furnace at 120° C. Trimethyl aluminum (TMA) was procured from Sigma Aldrich and dosed from a SurePak bottle. Deionized (DI) water was dosed from a stainless steel sample cylinder. A dosing pressure of 2 Torr for each precursor was used resulting in exposure times of 2 minutes for TMA and 7 minutes for $H_2O$.

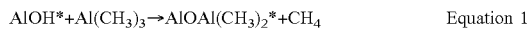

Equation 1

Equation 2

The resulting film composition was measured with inductively coupled plasma optical emission spectroscopy (ICP-OES). Brunauer-Emmett-Teller (BET) analysis was used to monitor surface area changes at various cycle numbers. Film thickness and conformity was studied with the use of energy dispersive X-ray spectroscopy (EDS), high resolution transmission electron microscopy (STEM), secondary ion mass spectroscopy (SIMS) and low-energy ion scattering (LEIS).

Based on the surface reactions that occur during each dose, the reaction can be monitored with mass spectrometry. The occurrence of the surface reaction is marked by the presence of the half-reaction byproduct in the effluent stream of the reactor. By tracking the presence of these byproduct species, the extent of the surface reaction can be determined. Reaction continues until all accessible preferred reaction sites on the substrate are reacted, at which point the surface is saturated. Once the surface was saturated and the self-limiting reaction was complete, breakthrough of the precursor molecule in the exhaust stream was observed with in-situ mass spectrometry. Methane, dimethyl aluminum (DMA), and $H_2O$ were tracked to monitor alumina deposition in-situ. Alumina films were deposited with 2, 4, 6, 8, 10, 12, and 15 cycles for comparison to uncoated NMC.

Figure 1A:
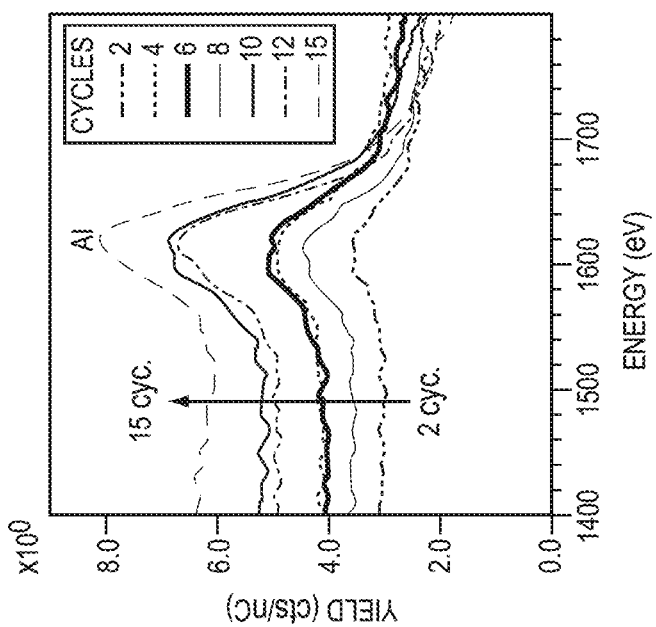
FIG. 1A is a graphical representation of the low energy ion scattering (LEIS) spectra of the aluminum characteristic peaks obtained when an ultra-thin alumina film was applied to cathode particles by ALD with 2, 4, 6, 8, 10, 12 and 15 cycles.

The full range of samples was analyzed with LEIS to determine the composition of the first atomic layer as more alumina was deposited. This analysis directly relates to the coverage of alumina on the surface of the powders. The samples were analyzed with 3 keV$^4$He$^+$ before and after an in-situ treatment with O atoms for 10 min. This O atom treatment removes hydrocarbons that have adsorbed from air. In addition, the samples were analyzed with 5 keV$^{20}$Ne$^+$ after the O atom treatment. Whereas an analysis by 3 keV$^4$He$^+$ gives an overview of all elements heavier than B, the analysis by 5 keV$^{20}$Ne$^+$ is best suited for the analysis of Mn, Ni and Co. FIG. 1A and FIG. 1B show that, as the cycle number increases, the aluminum signal increases, with a corresponding decrease in both the Mn and Co+Ni signals indicating that the film is coating the surface. The Mn and Co+Ni peaks are completely suppressed by 10 cycles of ALD.

Figure 2:
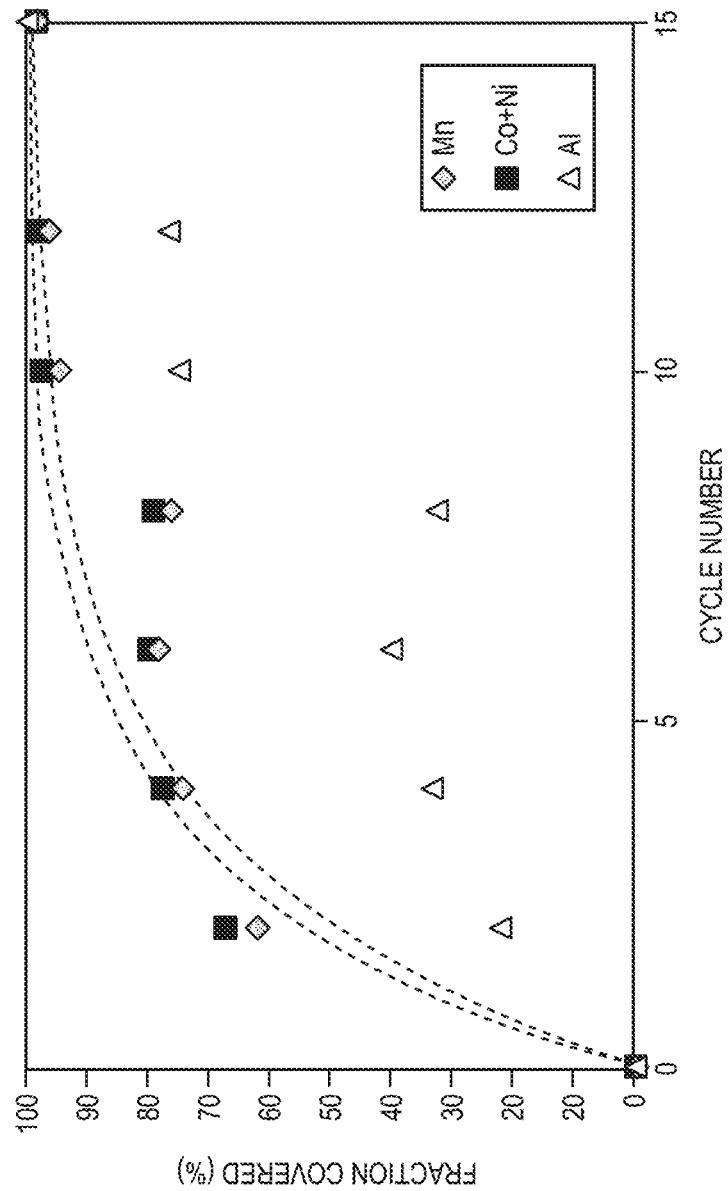
FIG. 2 depicts integrated LEIS data representing the fractional coverage of the surface as the number of cycles is increased from that depicted in FIG. 1.

FIG. 2 depicts integrated LEIS data representing the fractional coverage of the surface as the number of cycles is increased from that depicted in FIG. 1. The Mn, Co, and Ni areas are completely covered by 10 cycles. However the aluminum at the surface is not yet saturated as it would be at a complete film, indicating that the ALD preferentially deposits on the Mn, Co, and Ni areas while leaving Li uncovered until the continuous film is formed. The Mn, Co, and Ni areas are completely covered by 10 cycles.

We analyzed 3 keV$^4$He$^{+LEIS}$ spectra (not shown) for the samples after 2 cycles, before and after the treatment with O atoms. The spectra show peaks for O, Al and a step for Mn, Co, and Ni. Li could not be detected because the spectra is too light for analysis with 3 keV$^4$He$^+$. The "as is" spectrum also has a peak for C. Though this peak is small, one needs to keep in mind that the sensitivity of LEIS increases rapidly with mass. Hence, the small C peak represents a significant amount of C.

The spectra have two kinds of backgrounds. At low energy, the background is formed by sputtered particles, rather than scattered He$^+$ ions. Although they appear at the low energy side of the LEIS spectrum, for sputtered articles, these have a relatively high energy. This means that the mass of these sputtered ions is small. Usually, this background is formed by protons. In this case, the background will be from Li$^+$ ions, since the sample surface contains a large amount of Li$^+$.

The other background is the raised baseline, e.g., between 1800 and 2000 eV. This is due to scattering from Mn, Co, and Ni from layer below the surface. This background is high in 3 keV$^4$He$^+$ spectra, making it as high as the Mn, Co and Ni peaks. This makes it difficult to quantify these metals from the 3 keV$^4$He$^+$ spectrum. The background is much lower in 5 keV$^{20}$Ne$^+$ spectra. Therefore, the 5 keV$^{20}$Ne$^+$ spectra are used for the analysis of Mn, Co, and Ni.

We analyzed the 3 keV$^4$ He$^+$ spectra (not shown) for all samples after treatment with O atoms. With increasing cycle number, the Mn, Co and Ni signal decreases: the amount of Mn, Co, and Ni in the outermost atomic layer decreases. At the same time, the background for Mn, Co, and Ni shifts to lower energies: the Mn, Co, and Ni start deeper into the sample, since they are now covered by aluminum oxide. At the same time, the Al peak increases, since the amount of Al in the outermost atomic layer increases. We observed separate spectra where only the region around the Al peak was recorded. Since the 5 keV$^{20}$Ne$^+$ is best suited for the analysis of Mn, Ni and Co the quantitative analysis for these elements were done using that spectra.

The Al, Mn, and Co+Ni peaks were integrated to quantify the data. The Mn, and Co+Ni data was normalized to the uncoated sample to determine the fraction of the original Mn, Co, and Ni were covered. The Al data were normalized to the sample coated with 15 cycles since this should be a uniform film. The results are summarized in the below Table.

TABLE

Analytical integration of LEIS spectra peaks correlating to the percent coverage of Mn, Co, and Ni and the percent of maximum Al concentration.

| | % covered | | % of Max |
|---|---|---|---|
| cycle number | Mn | Co + Ni | Al |
| 0 | 0.0% | 0.0% | 0.0% |
| 2 | 62.4% | 67.5% | 22.5% |
| 4 | 74.5% | 78.1% | 33.5% |
| 6 | 79.4% | 80.2% | 40.4% |
| 8 | 76.7% | 79.4% | 33.0% |
| 10 | 95.1% | 97.5% | 75.6% |
| 12 | 97.2% | 98.5% | 77.0% |
| 15 | 100.0% | 99.1% | 100.0% |

TOF-SIMS (Physical Electronics TRIFT III) analysis was completed for a subset of 3 samples from the 8 samples that LEIS data were collected on. Samples composed of uncoated NMC, NMC with 4 cycles alumina ALD, and NMC with 15 cycles NMC were analyzed with TOF-SIMS to directly measure the lithium concentration within the first nm of the surface. The analysis was done using an Au$^+$ ion source at 22 keV and the analysis region was composed of a 250 µm square.

Figure 3:
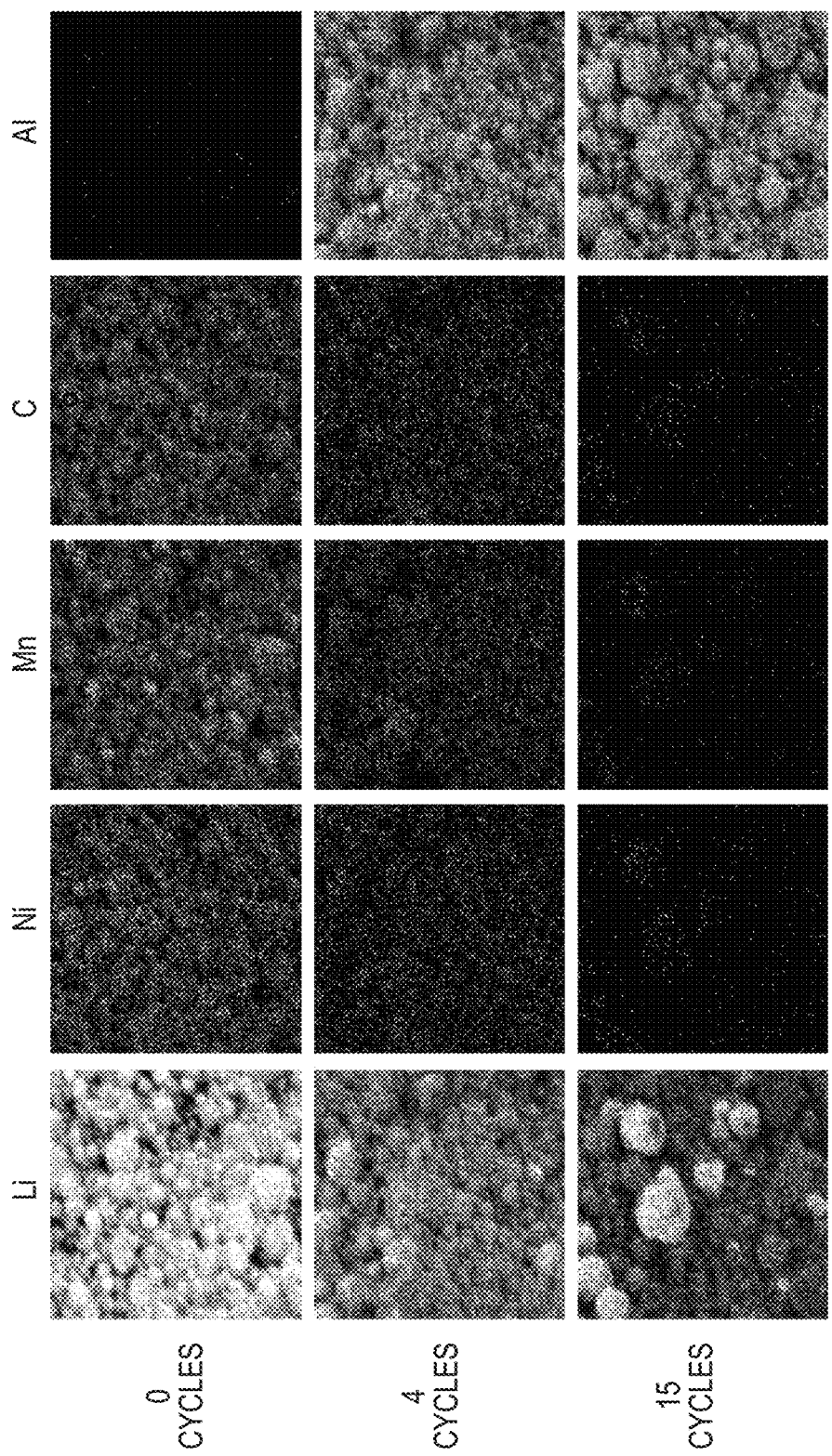
FIG. 3 shows ion images from Time-of-Flight Secondary Ion Mass Spectrometry (TOF-SIMS) analysis, wherein ion images of lithium, nickel, manganese, cobalt, and aluminum are presented left to right with the number of alumina cycles stacked top to bottom.

The TOF-SIMS ion images presented in FIG. 3 show the integrated intensities of mass selected ions as a function of pixel position. In these images, brighter colors correspond to higher intensities of the selected ion in the sample.

Figure 4:
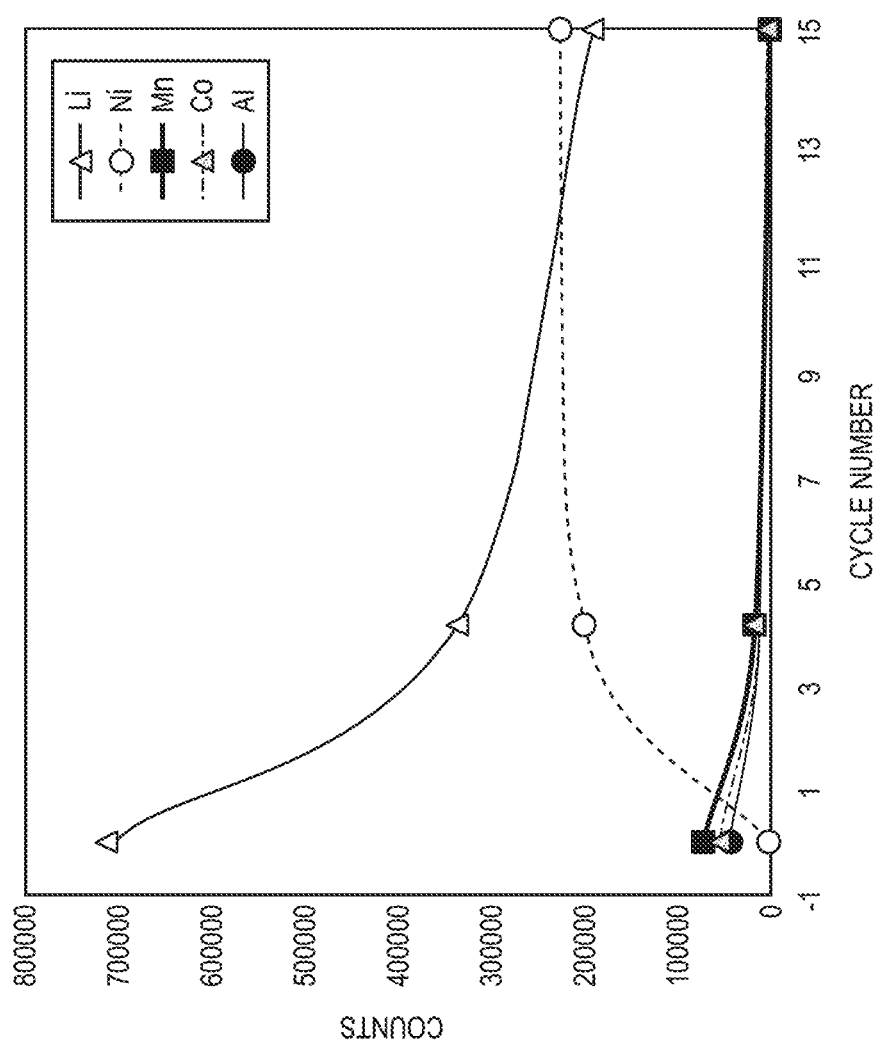
FIG. 4 is a graphical representation of TOF-SIMS signal intensity measured for Li, Ni, Mn, Co, and Al as a function of ALD cycle number.

In FIG. 4, the absolute signal values are plotted for direct comparison of surface concentration of species relative to the amount of ALD cycles deposited. From the ion images and the spectra collected across the range of samples it is clearly observed that the initial concentration of Ni, Mn, and Co are much lower than that of Li on the surface. We conclude that, as the addition of ALD cycles proceeds, the amount of Ni, Mn, and Co on the surface is suppressed completely, while the presence of Li is still clearly observed. The deposition is observed to completely depress the presence of transition metals on the sample surface prior to coverage of lithium.

Figure 5:
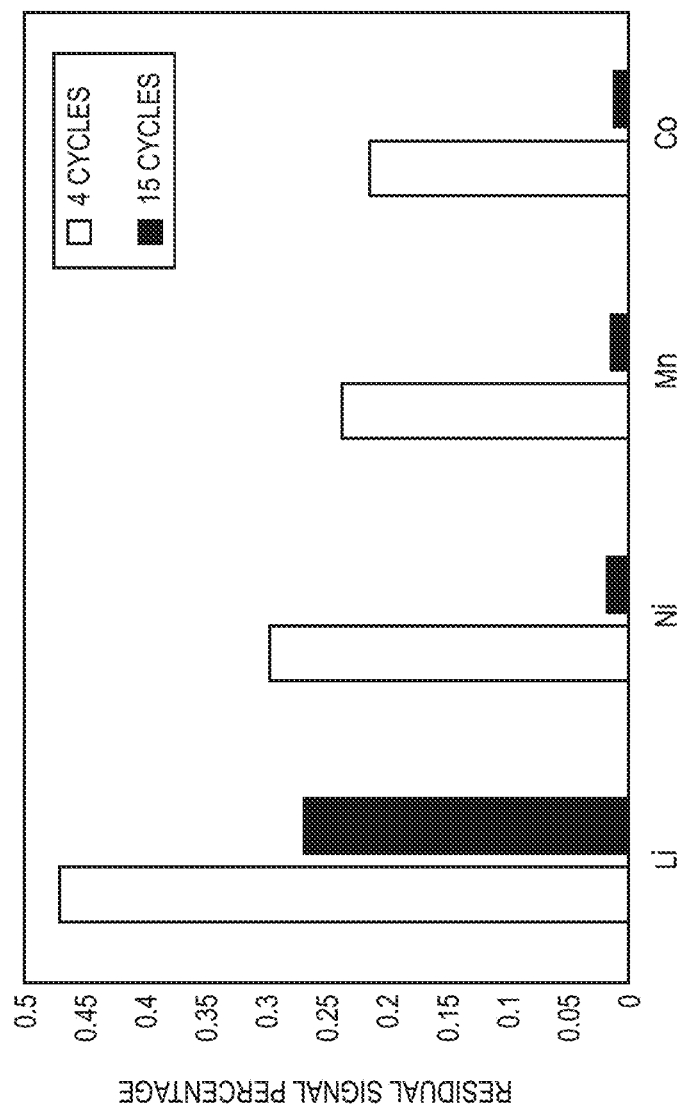
FIG. 5 is a graphical representation of the residual TOF-SIMS signal intensity for the main components of the NMC cathode (Li, Ni, Mn, and Co) after 4 cycles and 15 cycles of alumina ALD.

FIG. 5 is a graphical representation of residual signal percentages for 4 and 15 cycles for the Li, Ni, Mn, and Co components of the NMC cathode. The graph enables a comparison of the residual amount of each signal as the ALD proceeds, and shows that after 4 cycles of alumina the Ni, Mn, and Co are all 70-80% covered by alumina while almost 50% of the original Li signal is still observed. After 15 cycles of ALD the Ni, Mn, and Co signals have been completely suppressed; however, over 25% of the original Li signal is still present, indicating that the alumina ALD is preferentially coating the transition metal sites leaving Li exposed on the surface. Full coverage of surface lithium with greater than 1 nanometer (nm) alumina is not achieved within the study presented here.

Figure 6:
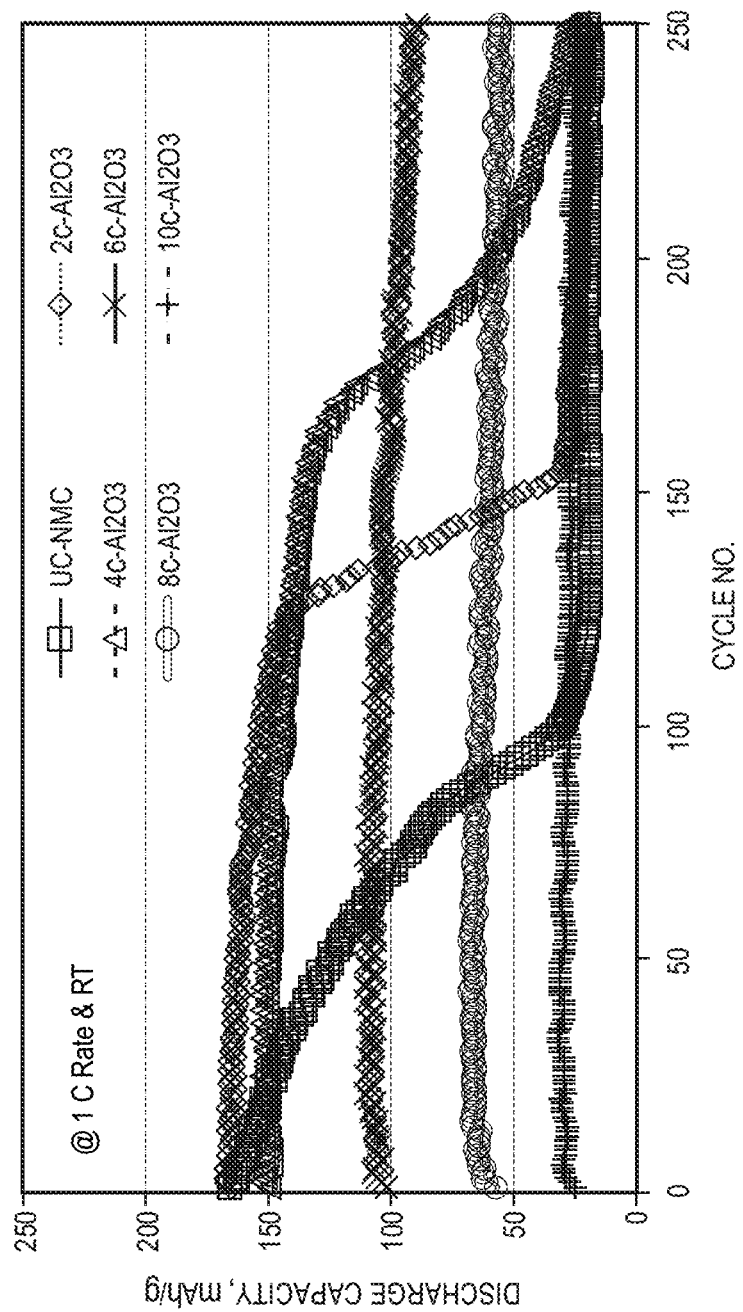
FIG. 6 is a graphical representation of 250 charge-discharge cycles at 1 C rate of uncoated NMC and NMC coated with 2, 4, 6, 8 and 10 cycles $Al_2O_3$.

FIG. 6 is a graphical representation of 250 charge-discharge cycles at 1 C rate of uncoated NMC and NMC coated with 2, 4, 6, 8 and 10 cycles $Al_2O_3$. The uncoated NMC was observed to deactivate completely within 100 cycles and showed immediate loss of capacity, while the samples with 2 and 4 cycles of $Al_2O_3$ showed stable performance up to 150 charge-discharge cycles and capacity magnitudes either equal to or greater than the uncoated cathode material. Samples with 6, 8, and 10 $Al_2O_3$ cycles show stability over the entire 250 cycles but have reduced capacity relative to the uncoated sample due to the insulative properties of $Al_2O_3$.

The LEIS analysis shows that the ALD process develops in a complex way.

Initially, the Mn, Co, and Ni oxide is covered, whereas the amount of Al does not reach its maximum. After 4-8 cycles, 80% of the Mn, Co, and Ni is covered, but the surface contains only 30-40% Al. Without being bound by theory, we conclude that the $Al_2O_3$ grows on the Mn, Co and Ni, at a much faster rate than on the parts of the surface that are covered by Li. From 10 to 15 cycles, the Mn, Co and Ni are completely covered, but the Al signal is still increasing. At this point, the layer is covering the remaining Li. All of the Mn, Co, and Ni is covered after 15 cycles. It is not clear whether all the Li is covered then, since it is not clear whether the Al signal is already saturated. LEIS cannot directly measure low atomic mass elements such as lithium. TOF-SIMS was used to measure lithium concentration near the surface. The main difference between the two methods is the penetration depth of the ion beam during analysis. LEIS measures first-atomic-layer concentrations, while TOF-SIMS measures concentrations within the first nm of the surface. The measurement of lithium surface concentration with TOF-SIMS results agree well with LEIS results that, although LEIS could not directly measure lithium, indicated that full coverage of the transition metal sites occurs before full coverage of the entire surface. The coupling of these results indicates that alumina ALD occurs via an island growth mechanism that is nucleated on transition metal surface sites and grows to cover Li sites slower. The semi-continuous nature of the film and the preferential deposition on transition metal sites within cathode materials allow the film to cover the metal oxide lattice blocking the Li sites.

An ultra-thin semi-continuous (or non-uniform) alumina film is applied to cathode particles by atomic layer deposition (ALD) for up to approximately 10 ALD cycles whereby the alumina film preferentially coats the Co, Ni, and Mn exposed surfaces of a lithium nickel manganese cobalt oxide cathode material, but does not as effectively coat the Li exposed surfaces. These substrate materials were coated with alumina using 0, 2, 4, 5, 6, 8, 10, 12, and 15 ALD cycles. The 0, 2, 4, and 15 cycle coated materials were made into electrodes and cycled in coin cells opposite lithium sites in order to determine the efficacy of each film. The coin cell battery testing was performed at the Missouri University of Science and Technology, Rolla, MO The semi-continuous and non-uniform nature of the films was explored using low energy ion scattering (LEIS) and Time-of-Flight Secondary Ion Mass Spectrometry (TOF-SIMS).

Coin cell performance of active materials: All cells were tested by galvanostatic charge and discharge at room temperature, first under 20 mA/g (0.1 C) between 2.5 and 4.6 V for 1 cycle, followed by hundreds of cycles at 200 mA/g (1 C). The initial discharge capacities were ~117, ~110, ~85, ~31 mAh/g for uncoated, 2-cycle, 4-cycle and 15-cycle, respectively.

Coin cell testing showed that a semi-continuous, non-uniform film generated within the first 10 cycles of deposition improves the cycling stability of lithium ion battery cathodes. However, once a fully uniform film has been formed, after approximately 15 cycles, the battery capacity dropped significantly.

In another experiment, a vibrating bed ALD reactor was prepared to continuously coat 160 kg of lithium nickel manganese cobalt oxide powders. The powders flowed continuously through the system at the rate of 32 kg/hour. They were exposed to 4 zones of trimethyl aluminum vapor dispersed in nitrogen and 4 zones of water vapor dispersed with appropriate purging regions between these zones.

For a vibrating bed reactor, a key consideration is the temperature and the flow rate of the substrate Li-ion battery cathode material vs. the flow rate of the ALD gases. It should be noted that, the temperature for alumina (TMA/water) can vary between about 77° C. and at least 150° C., or even much higher. The temperature used impacts film characteristics.

The $Al_2O_3$ coated NMC powders demonstrated initial lithium ion battery charge/discharge rates comparable to the uncoated materials. The $Al_2O_3$ coated NMC materials demonstrated increased lifetime as compared to the uncoated materials. The best battery performance was achieved cathodes coated using 2, 3, or 4 cycles of ALD.

Optimal number of cycles: The chemistry of both the substrate and the film, temperature, pressure, particle size, and particle morphology, may determine the optimal number of cycles to be used in order to achieve a desired thickness of the ultrathin metal oxide film or the fluoride film. Further, for ALD coating using the ALD process in a continuous reactor, it may require some extra analysis steps in order to know when it is optimal to stop the reactions. Some preliminary testing can be done, periodically stopping the deposition to analyze the thickness of the coatings.

In summary of the examples, we have deposited thin semi-continuous films on NMC cathode materials for lithium ion batteries. Films of alumina were deposited via ALD at 2, 4, 6, 8, 10, 12 and 15 cycles. This set of films covers various stages of semi-continuous growth to that of a complete film. Using ICP and BET analysis it appears that the film becomes a uniform layer at 10 cycles. However, using LEIS and TOF-SIMS, it was determined that the film is not fully continuous but is semi-continuous, because the Li sites or surfaces are not covered at the same rate as the M-oxide surface sites during ALD cycling. The ALD film preferentially deposits on areas of Mn, Co and Ni until they are completely covered at 10 cycles. Subsequent cycles between 10 and 15 cycles continue to cover Li-rich surfaces. Exemplification (Metal Fluoride Film Coatings on Lithiated Mixed Metal Oxides):

Metal fluorides are important coating materials for lithiated mixed metal oxides. Some metal fluorides can have similar or higher stabilities as metal oxides, especially when they are used in a fluorine containing environment, such as HF. These materials can be grown as ultra-thin films by ALD methods.

A fluidized bed ALD reactor was loaded with 200 g lithium nickel manganese cobalt oxide (NMC) powders. The powders were exposed to trimethyl aluminum vapors dispersed in nitrogen. The ALD reactor was purged. The powders were then exposed to hydrogen fluoride vapors dispersed in nitrogen and pyridine. The ALD reactor was purged again to complete the ALD cycle. This process was repeated 3 additional times for a total of 4 cycles of ALD-produced aluminum fluoride ($AlF_3$).

The $AlF_3$ coated NMC powders were used in a standard process to create a cathode for lithium ion batteries. When tested in a full cell, the $AlF_3$ coated NMC cathode demonstrated initial lithium ion battery charge/discharge rates comparable to the uncoated materials. The $AlF_3$ coated NMC materials demonstrated increased lifetime, and also show greater lithium ion conductivity as compared to the uncoated materials. The best battery performance was achieved cathodes coated using 2, 3, or 4 cycles of ALD.

EQUIVALENTS

While this invention has been particularly shown and described with references to preferred embodiments thereof, it will be understood by those skilled in the art that various changes in form and details may be made therein without departing from the scope of the invention encompassed by the appended claims.

What is claimed is:

1. A substrate comprising:
   a lithiated metal oxide cathode material comprising lithiated metal oxide particles having M-oxide sites and lithium ion sites, wherein M is at least one non-lithium metal;
   a first ultrathin film comprising a metal fluoride film, the first ultrathin film having a thickness up to 4 nanometers, the first ultrathin film at least partially covering the M-oxide sites and the lithium ion sites; and
   a second ultrathin film comprising a non-lithium-containing metal oxide film, the second ultrathin film having a thickness up to 4 nanometers,
   wherein the first ultrathin film and the second ultrathin film are semicontinuous,
   wherein a thickness of the first ultrathin film at least partially covering the M-oxide sites is greater than a thickness of the first ultrathin film at least partially covering the lithium ion sites, and
   wherein the metal fluoride film comprises one or more of $MnF_2$ and $HfF_4$.

2. The substrate of claim 1, wherein the thickness of the first ultrathin film or the thickness of the second ultrathin film is up to 3 nanometers.

3. The substrate of claim 1, wherein the substrate comprises Li exposed on a surface of the substrate.

4. The substrate of claim 1, wherein the metal fluoride film further comprises at least one of $CaF_2$ and $SrF_2$.

5. The substrate of claim 1, wherein an average diameter of the lithiated metal oxide particles is from 0.05 micrometers to 60 micrometers and wherein the lithiated metal oxide particles comprise lithium nickel cobalt manganese iron oxide.

6. The substrate of claim 1, wherein the non-lithium-containing metal oxide film comprises at least one of MgO, $Al_2O_3$, $SiO_2$, $TiO_2$, ZnO, $SnO_2$, $ZrO_2$, $NbO_3$, and $B_2O_3$.

7. The substrate of claim 1, wherein the lithiated metal oxide is selected from the group consisting of at least one of lithium cobalt oxide, lithium nickel oxide, lithium manganese oxide, lithium nickel cobalt manganese oxide, lithium nickel cobalt manganese iron oxide, lithium nickel cobalt aluminum oxide, and lithium titanate.

8. The substrate of claim 1, wherein the lithiated metal oxide is $LiNi_{0.33}Mn_{0.33}CO_{0.33}O_2$.

9. The substrate of claim 1, wherein the first ultrathin film comprises $MnF_2$.

10. The substrate of claim 3, wherein the thickness of the first ultrathin film ranges from zero to about 3 nanometers.

11. The substrate of claim 1, wherein the first ultrathin film or the second ultrathin film is deposited by atomic layer deposition (ALD) using from 2 ALD cycles to 11 ALD cycles.

12. The substrate of claim 11, wherein the first ultrathin film or the second ultrathin film is deposited by atomic layer deposition (ALD) using from 3 ALD cycles to 10 ALD cycles.

13. The substrate of claim 12, wherein the first ultrathin film or the second ultrathin film is deposited by atomic layer deposition (ALD) using from 3 ALD cycles to 6 ALD cycles.

14. An atomic layer deposition process to prepare the lithiated metal oxide particles of claim 4, wherein the particles are batch-processed in at least one of a fluidized bed, a rotating tube or cylinder, and a rotating blender.

15. An atomic layer deposition process to prepare the lithiated metal oxide particles of claim 4, wherein the particles are processed semi-batch or semi-continuously using at least one of sequential fluidized beds, rotating cylinders, and fixed mixers in series to move substrate particles through reaction zones.

16. An atomic layer deposition process to prepare the lithiated metal oxide particles of claim 4, wherein the particles are agitated and processed continuously and spatially, and move through successive zones where reactant gases and substrate particles are flowed continuously.

17. An atomic layer deposition process to prepare the lithiated metal oxide particles of claim 4, wherein the process is a vibrating bed process incorporating directional vibration, and wherein a gas velocity is below a minimum fluidization velocity of the particles such that the particles are not fluidized.

18. An atomic layer deposition process to prepare the lithiated metal oxide particles of claim 4, wherein the process is a vibrating bed process operated in a manner such that a gas velocity is sufficient to fluidize the particles.

19. An electrode comprising the substrate according to claim 1, wherein the first ultrathin film or the second ultrathin film is deposited by atomic layer deposition (ALD) using from 2 ALD cycles to 4 ALD cycles.

20. The substrate of claim 1, wherein the first ultrathin film comprises $HfF_4$.

* * * * *